United States Patent
Chen

(10) Patent No.: US 6,671,576 B1
(45) Date of Patent: Dec. 30, 2003

(54) WAFER CARRIER

(75) Inventor: Chih-Kun Chen, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/391,717

(22) Filed: Mar. 19, 2003

(30) Foreign Application Priority Data

Aug. 1, 2002 (TW) ........................................ 91117355 A

(51) Int. Cl.[7] ................................................. G06F 7/00
(52) U.S. Cl. ....................... 700/218; 700/258; 700/259; 414/937; 414/941; 901/47
(58) Field of Search ................................. 700/231, 214, 700/218, 245, 258, 259; 414/937, 941; 901/47

(56) References Cited

U.S. PATENT DOCUMENTS 5,044,752 A * 9/1991 Thurfjell et al. ............ 356/400
5,604,443 A * 2/1997 Kitamura et al. ........... 324/754
5,740,059 A * 4/1998 Hirata et al. ................ 700/213
5,783,834 A * 7/1998 Shatas ................... 250/559.33
6,618,645 B2 * 9/2003 Bacchi et al. ............... 700/254

* cited by examiner

Primary Examiner—Khoi H. Tran
(74) Attorney, Agent, or Firm—Nelson A. Quintero

(57) ABSTRACT

A wafer carrier device capable of detecting positioning precision of a supporting plate thereof. In the present invention, a supporting plate connected to a mechanical arm has three reflectors and a positioning window. A detection device has a vertical signal generator to output a vertical alignment signal to a vertical signal receiver, and three level detectors to each output a second signal to the corresponding reflector respectively and receive a corresponding reflected level detection signal from the corresponding reflector. A determining unit determines whether the supporting plate is aligned with the vertical signal receiver according to the vertical alignment signal. The determining unit outputs a position rectification signal when the supporting plate is not aligned with the vertical signal receiver. A driver moves the supporting plate by mechanical arm to align the vertical signal receiver according to the position rectification signal.

8 Claims, 5 Drawing Sheets

WAFER CARRIER

BACKGROUND OF THE INVENTION

1. Field of the Invention

The present invention relates to a wafer carrier, and in particular to a wafer carrier device capable of detecting the positioning precision of its supporting plate.

2. Description of the Related Art

At present, semiconductor wafers tend to have larger and larger sizes, wherein the manufacturing techniques for forming wafers have evolved from 6-inch wafers, to 12-inch wafers. The increase in wafer size also increases manufacturing costs for each wafer. Therefore, it is a priority to reduce the redundancy rate of wafers during manufacture as well as minimize pollution from improper processing of damaged wafers.

Wafers are damaged most frequently when processed in a wafer storage chamber or a reaction chamber and/or when conveyed to different locations by a carrier. Over time, the supporting plate and the automatic manipulator such as a mechanical arm that carry wafers tend to lose their positioning precision. As a result, the wafer cannot be accurately conveyed to predetermined positions, causing uneven temperature distribution or chemical deposition, erratic exposure, scratching, or even collision between wafers may occur, causing severe equipment damage.

Moreover, the defective wafers are typically not sorted out until most of the manufacturing process has been carried out. Namely, the operator of the process cannot be made aware before or during the mishap. As a result, the manufacturing cost is increased while the projected time of delivery is delayed. The above problem is further complicated since the exact cause of the problem cannot be pinpointed, which makes the situation even more difficult and therefore increases required repair time.

Therefore, precise positioning of the supporting plate on a carrier device is important to improve stability of the semiconductor manufacturing process.

SUMMARY OF THE INVENTION

Accordingly, an object of the present invention is to provide a wafer carrier device capable of detecting the positioning precision of its supporting plate, avoiding the above mentioned positioning problems.

In the wafer carrier device of the present invention, a supporting plate has three reflectors and a positioning window, and a mechanical arm connected to the supporting plate. A detection device has an alignment signal generator to output a first signal through the positioning window as an alignment signal, and three level detectors to each output a second signal to corresponding reflectors and receive a corresponding reflected level detection signal from the corresponding reflector. An alignment signal receiver receives the alignment signal, and a determining unit coupled to the alignment signal receiver and the detection device determines whether the supporting plate is aligned with the alignment signal receiver according to the alignment signal, and whether the supporting plate is in a horizontal orientation according to the three corresponding level detection signals. The determining unit outputs a position rectification signal when the supporting plate is aligned with the alignment signal receiver, and outputs a warning signal when horizontal orientation is not detected. A driver coupled to the determining unit moves the mechanical arm, and aligns the supporting plate by the alignment signal receiver according to the position rectification signal.

A detailed description is given in the following embodiments with reference to the accompanying drawings.

BRIEF DESCRIPTION OF THE DRAWINGS

The present invention can be more fully understood by reading the subsequent detailed description and examples with reference to the accompanying drawings, wherein.

DETAILED DESCRIPTION OF THE INVENTION

The present invention provides a wafer carrier device capable of detecting the positioning precision of its supporting plate and avoiding positioning problems.

Figure 1:
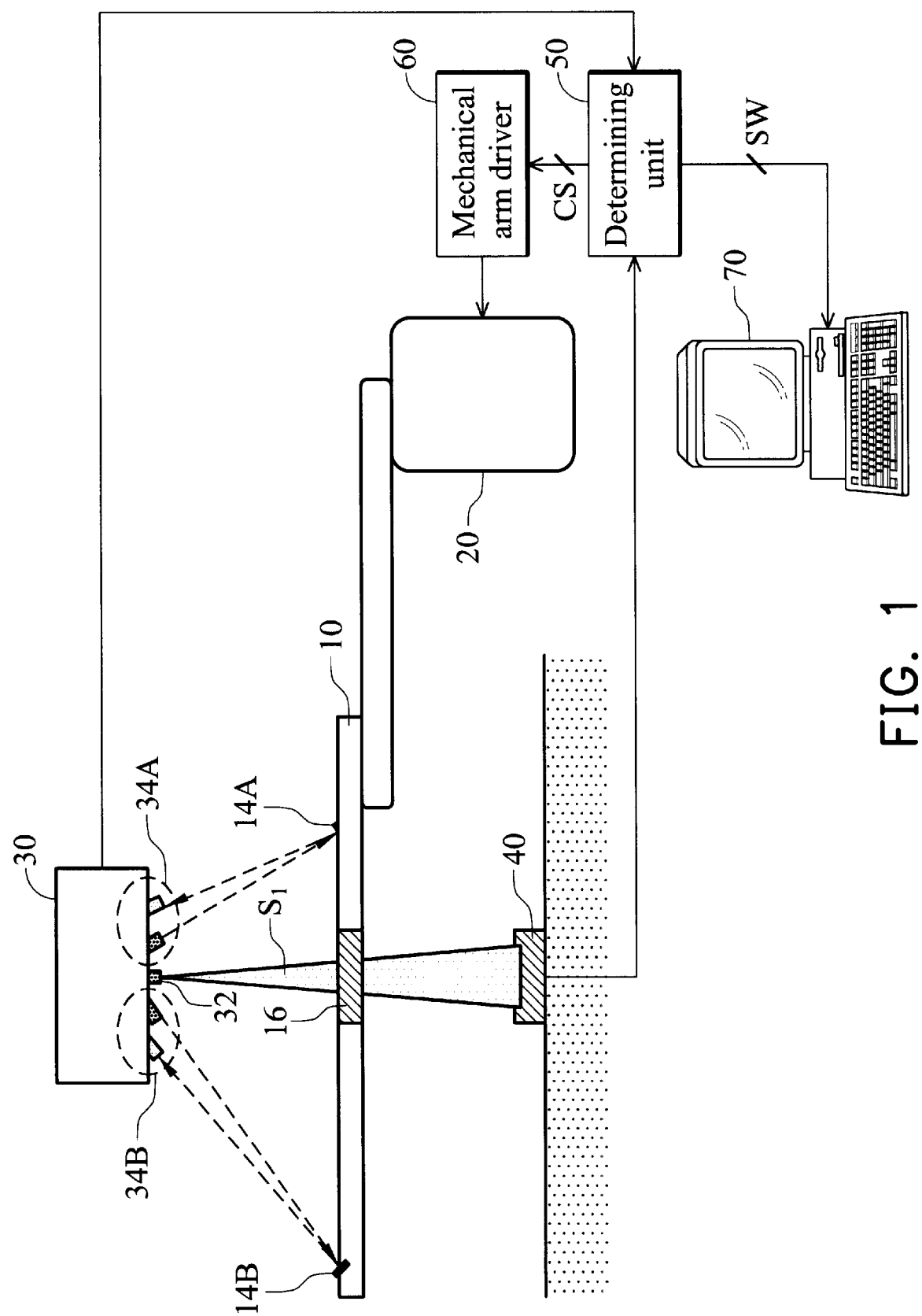
FIG. 1 is a diagram of the wafer carrier device according to the present invention.

As shown in FIG. 1, the carrier device 100 has a supporting plate 10, a mechanical arm 20, a detection device 30, an alignment signal receiver 40, the determining unit 50 and a driver 60.

The supporting plate 10, for example, is a blade, fixed on the mechanical arm 20. The supporting plate 10 has three reflectors 14A, 14B and 14C and a positioning window 16, wherein the positioning window 16 has a first pattern (not shown), and the three reflectors, for example, are mirrors lodged in the supporting plate 10.

A detection device 30 has an alignment signal generator 32 and three level detectors 34A, 34B and 34C. The alignment signal generator 32 outputs a first signal S1 through the positioning window as an alignment signal. Three level detectors 34A, 34B and 34C each output a second signal to the corresponding reflector 14A, 14B and 14C respectively. Each level detector (34A–34C) receives a corresponding reflected level detection signal from the corresponding reflector.

The alignment signal receiver 40 receives the alignment signal through the positioning window from the alignment signal generator 32.

The determining unit 50 is coupled to the alignment signal receiver 40 and the detection device 30 level detectors, and determines whether the supporting plate 10 is aligned with the alignment signal receiver 40 according to the alignment signal through the positioning window 16 from the alignment signal generator 30. Further, the determining unit 50 determines whether the supporting plate 10 is in a horizontal orientation according to the three corresponding reflected level detection signals from the three reflectors (14A, 14B and 14C). The determining unit outputs a position rectification signal CS when the supporting plate is not aligned with the vertical signal receiver, and outputs a warning signal SW when horizontal orientation is not detected.

A driver 60 coupled to the mechanical arm 20 moves the mechanical arm, and is also coupled to the determining unit to align supporting plate 10 by the alignment signal receiver 40 according to the position rectification signal CS.

Figure 2:
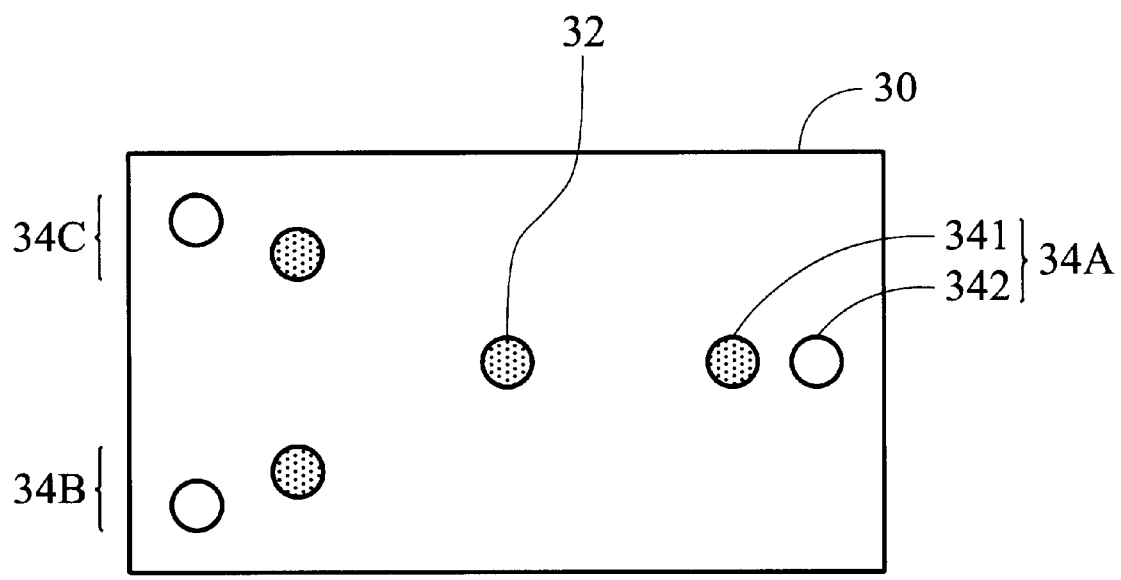
FIG. 2 is a diagram of the detection device of the present invention.

FIG. 2 is a diagram of the detection device according to the present invention. The detection device 30 has an alignment signal generator 32 and three level detectors 34A~34C. In the present invention, the vertical signal generator 32 is a divergent laser emitter. Each level detector has an emitter .to send the second signal S2 to the corresponding reflector, and a receiver to receive the level detection signal S3 from the corresponding reflector. In this case, each level detector is a laser emitter/receiver device.

Figure 3:
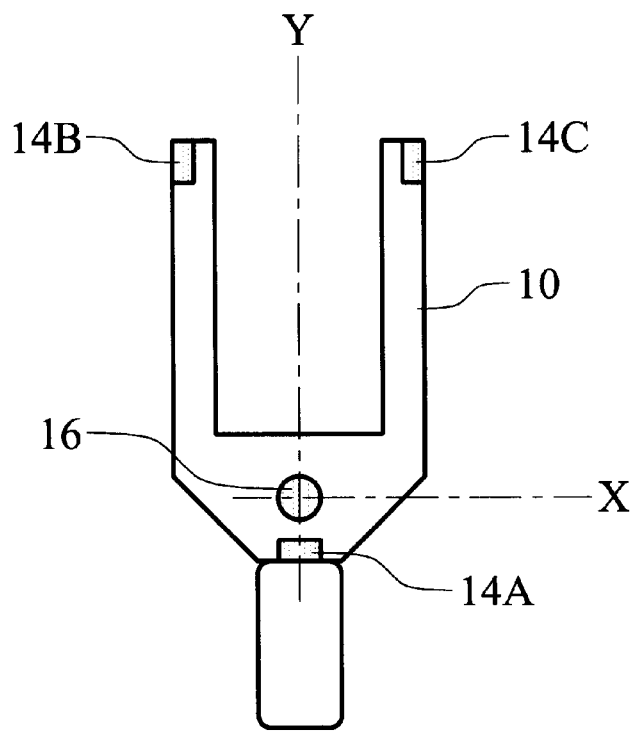
FIG. 3 shows the support plate of the present invention.

FIG. 3 shows the supporting plate of the wafer carrier device according to the present invention. The supporting plate 10 has three mirrors lodged therein acting respectively as the three reflectors 14A~14C to reflect the second signal from the emitter of three level detectors, respectively, as the level detection signals S3 to the receiver of the three level detectors 34A~34C. The supporting plate 10 also has a positioning window 16 with a first pattern (not shown). The alignment signal with the first pattern is produced when the first signal outputted from the alignment signal generator 32 passes through the positioning window 16. The wafer carrier device further has an alignment signal receiver with a second pattern (not shown), deposited in a predetermined location, for aligning with the supporting plate 10.

Figure 4A:
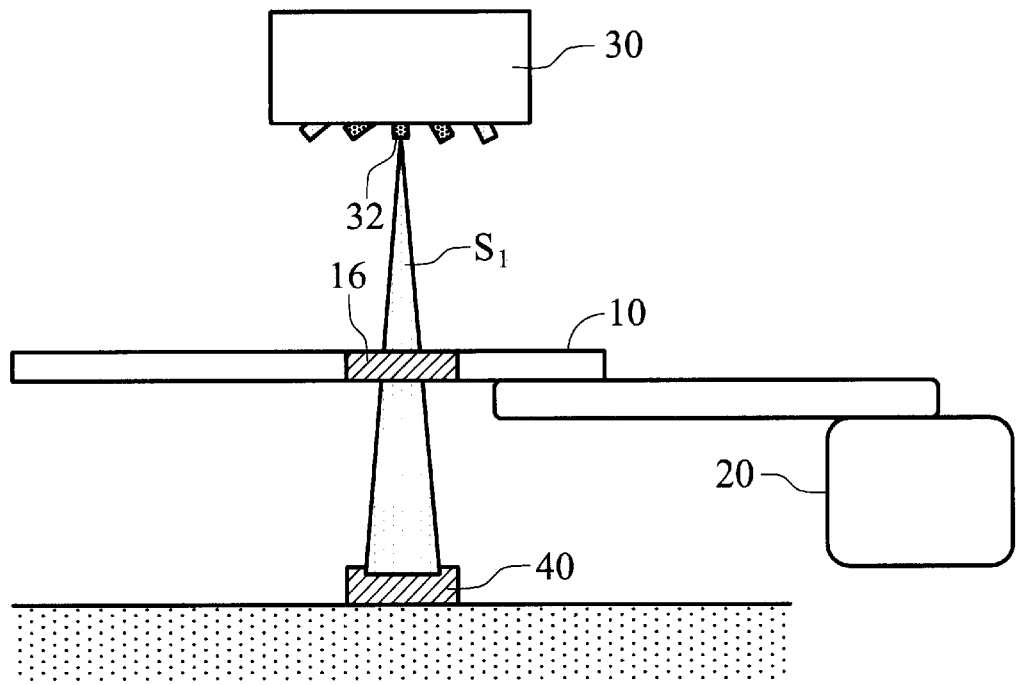
FIGS. 4a to 4c are diagrams illustrating the wafer carrier device during vertical positioning.
Figure 4B:
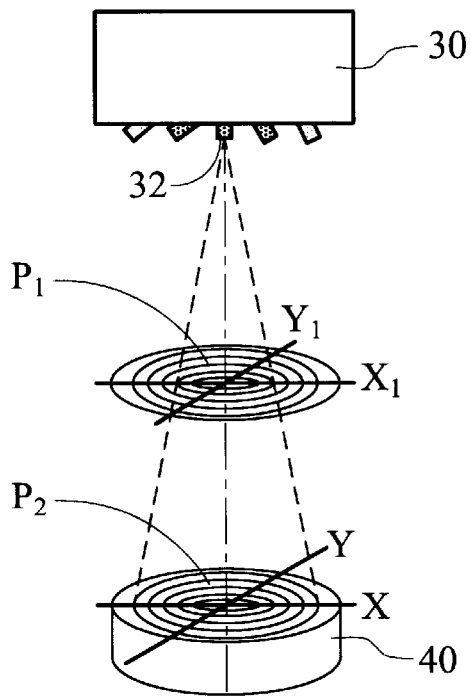
Figure 4C:
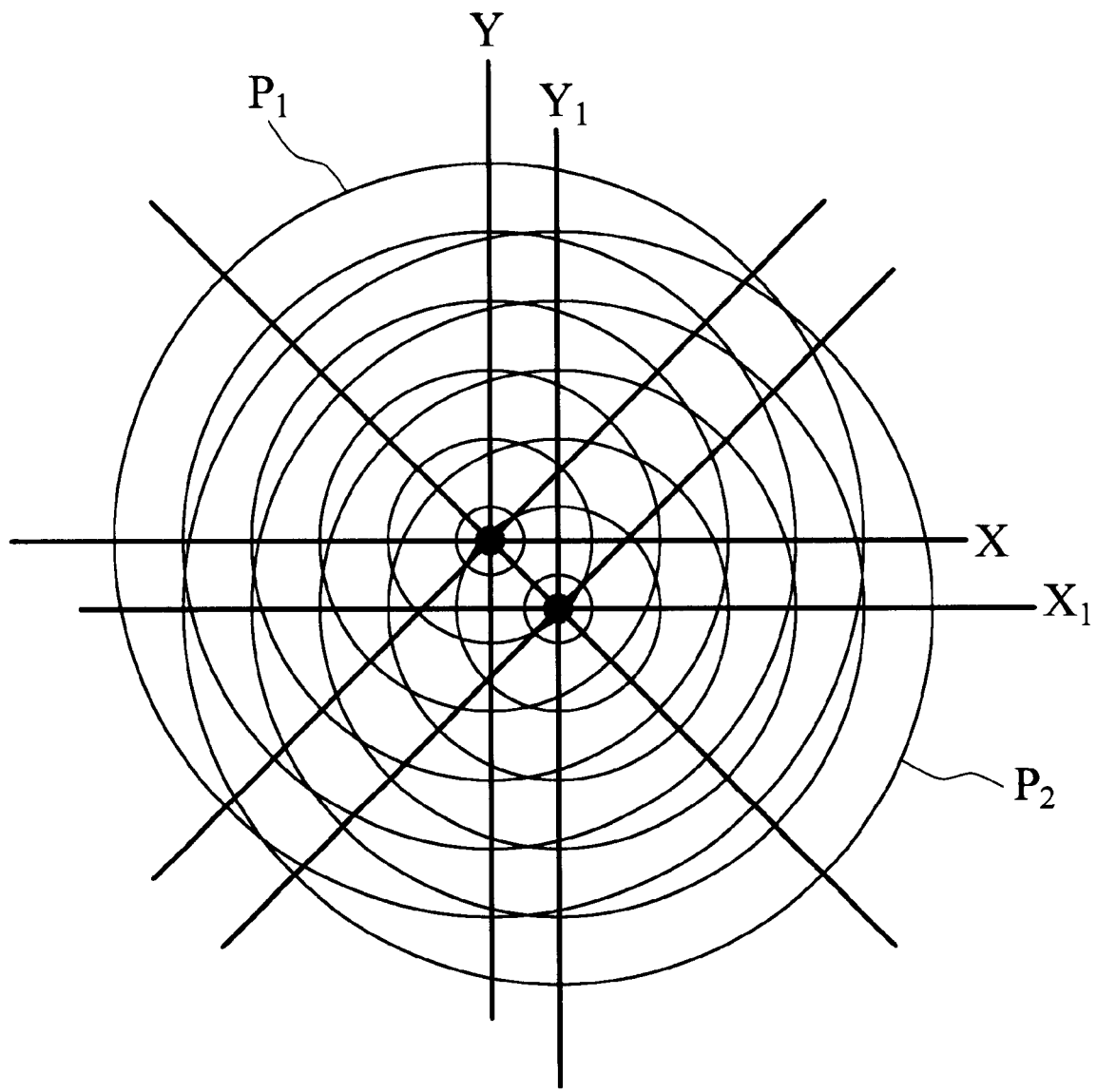

FIGS. 4a to 4c are diagrams illustrating the wafer carrier device during vertical positioning. As shown in FIGS. 4a and 4b, the alignment signal generator sends out a first signal S1 through the positioning window 16 to obtain an alignment signal with the first pattern P1. After the alignment signal receiver 40 receives the alignment signal, the determining device determines whether the supporting plate 10 is aligned with the alignment signal receiver 40 according to whether the first pattern P1 of the alignment signal matches a second pattern P2 of the alignment signal receiver 40. FIG. 4c shows the first pattern not matching the second pattern of the alignment signal receiver 40 when the support plate is not aligned with the alignment signal receiver 40. At this time, according to the two patterns P1 and P2, the determining device calculates the inaccuracy therebetween and outputs a position rectification signal CS to the driver 60. The driver 60 aligns the alignment signal receiver 40 by the supporting plate 10 according to the position rectification signal CS.

Figure 5A:
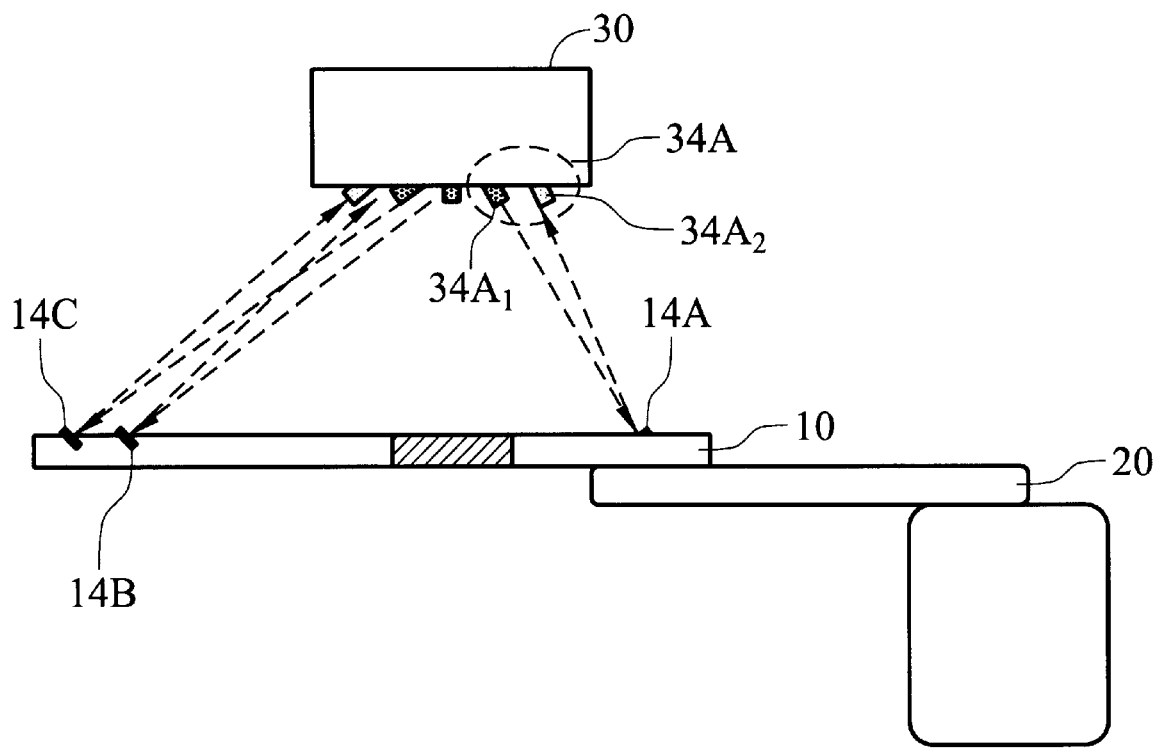
FIGS. 5a and 5b are diagrams illustrating the wafer carrier device during horizontal detection.
Figure 5B:
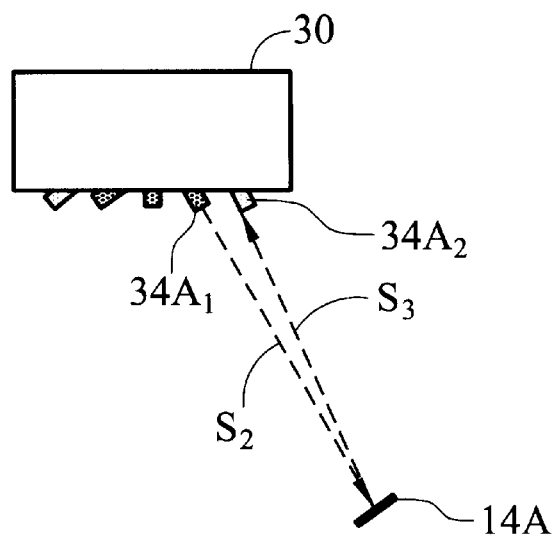

After the wafer carrier device executes the vertical positioning alignment, level detection is executed. FIGS. 5a and 5b illustrate the wafer carrier device during horizontal detection.

Each laser emitter $34A_1$ of the three level detectors 34A~34C outputs a second signal S2. The reflectors 14A~14C reflect the corresponding second signals S2, respectively, to the corresponding laser receiver $34A_2$ of the detectors (14A~14C), as the level detection signals S3.

Next, the determining device determines whether the supporting plate is in a horizontal orientation according to the level detection signals. For example, horizontal orientation is not detected if one of the laser receivers of the three level detectors 14A~14C does not receive its corresponding level detection signal S3, and the determining device outputs a warning signal to the display 70 to advise process engineers. Also, the determining device 50 further detects the level position of the supporting plate according to the reflect angle of the level detection signals S2 for the sequential rectification.

In the present invention, the wafer carrier device can detect the positioning of the supporting plate at every conveyance step, at predetermined time intervals, or after conveying a predetermined number of wafers.

Therefore, the present invention can detect the inaccuracy of the supporting plate and calibrate this inaccuracy easily. As well, the present invention can avoid collision between and loss of wafers caused by inaccurate positioning of the supporting plate. Consequently, the present invention can maintain the positioning precision of the supporting plate when the wafers are conveyed to different locations by a carrier device to improve stability of the semiconductor manufacturing processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer carrier device capable of detecting positioning precision of a supporting plate therein, comprising:

a supporting plate having three reflectors and a positioning window;

a mechanical arm connected to the supporting plate;

a detection device having an alignment signal generator to output a first signal through the positioning window as an alignment signal, and three level detectors to each output a second signal to the corresponding reflector respectively and each receive a corresponding reflected level detection signal from the corresponding reflector;

an alignment signal receiver for receiving the alignment signal;

a determining unit coupled to the alignment signal receiver and the detection device, to determine whether the supporting plate is aligned with the alignment signal receiver according to the alignment signal, and to determine whether the supporting plate is in a horizontal orientation according to the three corresponding level detection signals, wherein the determining unit outputs a position rectification signal when the supporting plate is not aligned with the alignment signal receiver, and outputs a warning signal when horizontal orientation is not detected; and a driver coupled to the determining unit to move the mechanical arm, aligning the supporting plate by the alignment signal receiver according to the position rectification signal.

2. The wafer carrier device as claimed in claim 1, wherein the determining unit determines the horizontal position of the supporting plate according to the corresponding level detection signals.

3. The wafer carrier device as claimed in claim 1, further comprising a display unit for warning signals.

4. The wafer carrier device as claimed in claim 1, wherein the alignment signal generator is a divergent laser emitter.

5. The wafer carrier device as claimed in claim 1, wherein the level detectors are laser emitter/detector units to output the second signals and to receive the corresponding level detection signals reflected from the reflectors respectively.

6. The wafer carrier device as claimed in claim 1, wherein the reflectors are mirrors lodged in the supporting plate.

7. The wafer carrier device as claimed in claim 1, wherein the positioning window and the alignment signal receiver have a first alignment pattern and a second alignment pattern respectively, the alignment signal with the first alignment pattern being produced when the first signal passes through the positioning window.

8. The wafer carrier device as claimed in claim 7, wherein the determining unit determines whether the supporting plate is aligned with the alignment signal receiver according to whether the first alignment pattern of the alignment signal matches the second pattern of the alignment signal receiver.

* * * * *